(12) United States Patent
Braatz et al.

(10) Patent No.: US 11,614,491 B2
(45) Date of Patent: Mar. 28, 2023

(54) SYSTEMS AND METHODS FOR PREDICTING THE CYCLE LIFE OF CYCLING PROTOCOLS

(71) Applicant: Toyota Research Institute, Inc., Los Altos, CA (US)

(72) Inventors: Richard Dean Braatz, Arlington, MA (US); Benben Jiang, Cambridge, MA (US); Fabian Mohr, Cambridge, MA (US); Michael Forsuelo, Cambridge, MA (US); William E. Gent, Redwood City, CA (US); Patrick K. Herring, Mountain View, CA (US); William C. Chueh, Stanford, CA (US); Stephen J. Harris, Walnut Creek, CA (US)

(73) Assignees: Toyota Research Institute, Inc., Los Altos, CA (US); Massachusetts Institute of Technology, Cambridge, MA (US); The Board of Trustees of the Leland Stanford Junior University, Stanford, CA (US)

( * ) Notice: Subject to any disclaimer, the term of this patent is extended or adjusted under 35 U.S.C. 154(b) by 4 days.

(21) Appl. No.: 17/235,356

(22) Filed: Apr. 20, 2021

(65) Prior Publication Data
US 2022/0341995 A1  Oct. 27, 2022

(51) Int. Cl.
*G01R 31/367* (2019.01)
*H01M 10/42* (2006.01)
*G01R 31/392* (2019.01)

(52) U.S. Cl.
CPC ......... *G01R 31/367* (2019.01); *G01R 31/392* (2019.01); *H01M 10/42* (2013.01); *H01M 2220/20* (2013.01)

(58) Field of Classification Search
None
See application file for complete search history.

(56) References Cited

U.S. PATENT DOCUMENTS

| | | | | |
|---|---|---|---|---|
| 8,855,954 B1 * | 10/2014 | Bickford | .............. | G01R 31/392 |
| | | | | 702/63 |
| 2019/0257886 A1 | 8/2019 | Hooshmand et al. | | |

FOREIGN PATENT DOCUMENTS

| | | |
|---|---|---|
| CN | 102778653 A | 11/2012 |
| CN | 104778337 A | 7/2015 |
| JP | 2018037794 A1 | 6/2019 |

OTHER PUBLICATIONS

Jafari et al., "Hierarchical Bayesian Model for Probabilistic Analysis of Electric Vehicle Battery Degradation", Dec. 2019, IEEE transactions on transportation electrification, Dec. 2019, vol. 5 (4), p. 1254-1267 (Year: 2019).*

(Continued)

*Primary Examiner* — Brent A. Fairbanks
(74) *Attorney, Agent, or Firm* — Christopher G. Darrow; Darrow Mustafa PC

(57) ABSTRACT

System, methods, and other embodiments described herein relate to improving the cycling of batteries by using data and a hierarchical Bayesian model (HBM) for predicting the cycle life of a cycling protocol. In one embodiment, a method includes classifying cycle life of a battery into a class using battery data from cycling with a protocol, wherein the class represents cycle life distributions of cycling protocols. The method also includes quantifying, using the class in a HBM, variability for the battery induced by the protocol. The method also includes predicting, using the HBM, an adjusted cycle life for the protocol according to the variability. The method also includes communicating the adjusted cycle life to operate the battery.

20 Claims, 7 Drawing Sheets

(56) References Cited

OTHER PUBLICATIONS

Attia, "Closed-loop optimization of fast-charging protocols for batteries with machine learning", Feb. 2020, Nature, 578(7795), pp. 397-402 (Year: 2020).*
An et al., "Fast formation cycling for lithium ion batteries," Journal of Power Sources, 342, pp. 846-852, 2017.
Baumhöfer et al., "Production caused variation in capacity aging trend and correlation to initial cell performance," Journal of Power Sources, 247, pp. 332-338, 2014.
Hong et al., "Towards the swift prediction of the remaining useful life of lithium-ion batteries with end-to-end deep learning," Applied Energy, 278:115646, pp. 1-12, 2020.
Waag et al., "Critical review of the methods for monitoring of lithium-ion batteries in electric and hybrid vehicles," Journal of Power Sources, 258, pp. 321-339, 2014.
Dunn et al., "Electrical energy storage for the grid: A battery of choices," Science, 334(6058), pp. 928-935, 2011.
Anseán et al., "Fast charging technique for high power lithium iron phosphate batteries: A cycle life analysis," Journal of Power Sources, 239, pp. 9-15, 2013.
Mukhopadhyay et al., "Deformation and stress in electrode materials for Li-ion batteries," Progress in Materials Science, 63, pp. 58-116, 2014.
Zuo et al., "Silicon based lithium-ion battery anodes: A chronicle perspective review," Nano Energy, 31, pp. 113-143, 2017.
Liu et al., "Challenges and opportunities towards fast-charging battery materials," Nature Energy, 4, pp. 540-550, 2019.
Zhang et al., "Charging optimization in lithium-ion batteries based on temperature rise and charge time," Applied Energy, 194, pp. 569-577, 2017.
Severson et al., "Data-driven prediction of battery cycle life before capacity degradation," Nature Energy, 4, pp. 383-391, 2019.
Attia et al., "Closed-loop optimization of fast-charging protocols for batteries with machine learning," Nature, 578, pp. 397-402, 2020.
Richardson et al., "Gaussian process regression for forecasting battery state of health," Journal of Power Sources, 357, pp. 209-219, 2017.
Kemp et al., "Learning overhypotheses with hierarchical Bayesian models," Developmental Science, 10(3) pp. 307-321, 2007.
Huang et al., "The minimum error minimax probability machine," Journal of Machine Learning Research, 5, pp. 1253-1286, 2004.
Lanckriet et al., "A robust minimax approach to classification," Journal of Machine Learning Research, 3, pp. 555-582, 2003.
Cano et al., "Batteries and fuel cells for emerging electric vehicle markets," Nature Energy, 3, pp. 279-289, 2018.
Schmuch et al., "Performance and cost of materials for lithium-based rechargeable automotive batteries," Nature Energy, 3(4), pp. 267-278, 2018.
Ahmed et al., "Enabling fast charging—A battery technology gap assessment," Journal of Power Sources, 367, 55 pages, 2017.
Yang et al., "Understanding the trilemma of fast charging, energy density and cycle life of lithium-ion batteries," Journal of Power Sources, 402, pp. 489-498, 2018.
Segler et al., "Planning chemical syntheses with deep neural networks and symbolic AI," Nature, 555, pp. 604-610, 2018.
Butler et al., "Machine learning for molecular and materials science," Nature, 559, pp. 547-555, 2018.
Brandt et al., "Rapid photovoltaic device characterization through Bayesian parameter estimation," Joule, 1(4), pp. 843-856, 2017.
Tabor et al., "Accelerating the discovery of materials for clean energy in the era of smart automation," Nature Reviews Materials, 3, pp. 5-20, 2018.
Correa-Baena et al., "Accelerating materials development via automation, machine learning, and high-performance computing," Joule, 2(8), pp. 1410-1420, 2018.
Jain et al., "Commentary: The Materials Project: A materials genome approach to accelerating materials innovation," APL Materials, vol. 1, pp. 1-11, 2013.
Sendek et al., "Holistic computational structure screening of more than 12000 candidates for solid lithium-ion conductor materials," Energy & Environmental Science, 10(1), pp. 306-320, 2017.
Tenenbaum et al., "How to grow a mind: Statistics, structure, and abstraction," Science, 331(6022), pp. 1279-1285, 2011.
Salakhutdinov et al., "One-shot learning with a hierarchical nonparametric Bayesian model," Proceedings of ICML Workshop on Unsupervised and Transfer Learning, pp. 195-207, 2012.
Lake et al., "Human-level concept learning through probabilistic program induction," Science, 350(6266), pp. 1332-1338, 2015.
Perfors et al., "Learning to learn categories," Proceedings of the 31st Annual Conference of the Cognitive Science Society, pp. 136-141, 2009.
Fernald et al., "Picking up speed in understanding: Speech processing efficiency and vocabulary growth across the second year," Developmental Psychology, 42(1), pp. 98-116, 2006.
Griffiths et al., "Probabilistic models of cognition: Exploring representations and inductive biases," Trends in Cognitive Sciences, 14(8), pp. 357-364, 2010.
Shafto et al., "Learning cross-cutting systems of categories," Proceedings of the 28th Annual Conference of the Cognitive Science Society, pp. 2146-2151, 2006.
Semmens et al., "Quantifying inter-and intra-population niche variability using hierarchical Bayesian stable isotope mixing models," PloS One, vol. 4, issue 7, pp. 1-9, 2009.
Cready et al., "Final report technical and economic feasibility of applying used EV batteries in stationary applications," Sandia National Laboratory, 130 pages, 2003.
Goodenough et al., "Challenges for rechargeable Li batteries," Chemistry of Materials, vol. 22, No. 3, pp. 587-603, 2010.
Das et al., "Electrochemical kinetics of SEI growth on carbon black: Part II Modeling," Journal of The Electrochemical Society, vol. 166, No. 4, pp. E107-E118, 2019.
Huang et al., "Evolution of the solid-electrolyte interphase on carbonaceous anodes visualized by atomic-resolution cryogenic electron microscopy," Nano Letters, 19(8), pp. 5140-5148, 2019.
Pinson et al., "Theory of SEI formation in rechargeable batteries: capacity fade, accelerated aging and lifetime prediction," Journal of The Electrochemical Society, 160(2), pp. A243-A250, 2013.
Horstmann et al., "Review on multi-scale models of solid-electrolyte interphase formation," Current Opinion in Electrochemistry, 13, pp. 61-69, 2019.
Thomas-Alyea et al., "In situ observation and mathematical modeling of lithium distribution within graphite," Journal of The Electrochemical Society, 164(11), pp. E3063-E3072, 2017.
Krueger et al., "How do reactions at the anode/electrolyte interface determine the cathode performance in lithium-ion batteries?" Journal of The Electrochemical Society, 160(4), pp. A542-A548, 2013.
Hausbrand et al., "Fundamental degradation mechanisms of layered oxide Li-ion battery cathode materials: Methodology, insights and novel approaches," Materials Science and Engineering, vol. 192, pp. 3-25, 2015.
Guéguen et al., "Decomposition of LiPF6 in high energy lithium-ion batteries studied with online electrochemical mass spectrometry," Journal of The Electrochemical Society, 163(6), pp. A1095-A1100, 2016.
Harris et al., "Effects of inhomogeneities—nanoscale to mesoscale—on the durability of Li-ion batteries," The Journal of Physical Chemistry C, 117(13), pp. 6481-6492, 2013.
Zhu et al., "How far away are lithium-sulfur batteries from commercialization?" Frontiers in Energy Research, vol. 7, article 123, pp. 1-12, Nov. 2019.
Gent et al., "Design rules for high-valent redox in intercalation electrodes," Joule. 4(7), pp. 1369-1397, 2020.
K.P. Murphy, "Machine Learning: A Probabilistic Perspective," Cambridge, MA, USA: MIT Press, 27 pages, 2012.
Kirchhof et al., "Root Cause Analysis in Lithium-Ion Battery Production with FMEA-Based Large-Scale Bayesian Network," CIRP Journal of Manufacturing Science and Technology, pp. 1-18, Jun. 15, 2020.

(56) References Cited

OTHER PUBLICATIONS

Jafari et al., "Hierarchical Bayesian Model for Probabilistic Analysis of Electric Vehicle Battery Degradation," IEEE Transactions on Transportation Electrification, vol. 5, No. 4, pp. 1254-1267, Dec. 2019.
Greenbank et al., "Automated feature selection for data-driven models of rapid battery capacity fade and end of life," 8 pages, Jan. 12, 2021.
Aitio et al., "Bayesian Parameter Estimation Applied to the Li-ion Battery Single Particle Model with Electrolyte Dynamics," 8 pages, Jan. 27, 2020.
Roman et al., "Machine Learning Pipeline for Battery State of Health Estimation" Nature Machine Intelligence, pp. 1-32, Apr. 5, 2021.

\* cited by examiner

SYSTEMS AND METHODS FOR PREDICTING THE CYCLE LIFE OF CYCLING PROTOCOLS

TECHNICAL FIELD

The subject matter described herein relates, in general, to cycling protocols for batteries, and, more particularly, using a Bayesian model for predicting the cycle life of a cycling protocol.

BACKGROUND

Battery parameters vary due to development, manufacturing, or chemistry. The parameters may also change through use in the field by a device powered by the battery. In addition, cycling protocols that control the charging or discharging of a battery have an effect on the performance of battery parameters. Moreover, cycling protocols, such as a charging protocol, of the battery may determine the utility and cycle life of the battery by controlling electrochemical conditions during operation. The cycle life of a battery may represent the number of cycles, such as charging cycles, until maximum charge and other performance parameters degrade due to wear. In one approach, a system using fast-charging protocols with multistep may have shorter charging without sacrificing the cycle life by minimizing degradation. However, the battery parameters related to cycle life and performance may vary differently from the degradation of cells using regular charging. As such, optimizing performance and operation using different cycling protocols may demand long testing times and complexity from the variability of battery parameters for different cycling protocols. Correspondingly, development time and costs may increase for new battery technologies due to the testing and optimization.

Regarding testing, different approaches may involve cycling a battery under extreme temperatures and rates to accelerate a testing process and decrease development time. As part of testing, the system may also predict the cycle life of a battery according to different cycling protocols, which can be based on the electrochemical response during initial cycling. However, this approach to testing is extensive and repetitive to account for cell-to-cell variability, performance parameters, or errors for cycle life predictions associated with cycling protocols. The repetitive testing may also involve complex protocols or produce protocol predictions inaccurately, thereby reducing the cycle life and range of the battery.

SUMMARY

In one embodiment, example systems and methods relate to a manner of improving the cycling of batteries using data and a Bayesian model for predicting the cycle life of a cycling protocol. In various implementations, systems using battery data for predicting the cycle life of a cycling protocol may involve extensive and repetitive testing to account for cell-to-cell variability or battery errors. Furthermore, a system accelerating testing for cycling protocols may produce inaccurate predictions due to the variability. Accordingly, prediction systems may encounter difficulties for expediently and reliably predicting battery performance of cycling protocols causing frustration.

Therefore, in one embodiment, a prediction system reduces testing times of a cycling protocol using data and a prediction model, which classifies a cycling protocol according to cycle life, with a hierarchical Bayesian model (HBM) to predict the performance using distributions of cycle life from other cycling protocols. In one approach, the prediction system may construct features from electrochemical data about cycled batteries using a prediction model. The constructed features may derive from a few cycles by a new or updated cycling protocol. Regarding accuracy, the prediction system may define classes associated with the constructed features using the HBM to produce accurate predictions with a few measurements irrespective of uncertainties from the prediction model. As such, the prediction system accounts for cell-to-cell variability and uncertainties from predicting the cycle life of cycling protocols by using the HBM. Thus, the prediction system may substantially reduce testing time compared to predicting the cycle life alone by using the HBM and addressing the uncertainties of the prediction model.

In one embodiment, a prediction system for improving the cycling of batteries using data and a HBM for predicting the cycle life of a cycling protocol is disclosed. The prediction system includes a memory communicably coupled to a processor. The memory stores a prediction module including instructions that when executed by the processor cause the processor to classify cycle life of a battery into a class using battery data from cycling with a protocol, wherein the class represents cycle life distributions of cycling protocols. The prediction module also includes instructions to quantify, using the class in a HBM, variability for the battery induced by the protocol. The prediction module also includes instructions to predict, using the HBM, an adjusted cycle life for the protocol according to the variability. The prediction module also includes instructions to communicate the adjusted cycle life to operate the battery.

In one embodiment, a non-transitory computer-readable medium for improving the cycling of batteries using data and a HBM for predicting the cycle life of a cycling protocol and including instructions that when executed by a processor cause the processor to perform one or more functions is disclosed. The instructions include instructions to classify cycle life of a battery into a class using battery data from cycling with a protocol, wherein the class represents cycle life distributions of cycling protocols. The instructions also include instructions to quantify, using the class in a HBM, variability for the battery induced by the protocol. The instructions also include instructions to predict, using the HBM, an adjusted cycle life for the protocol according to the variability. The instructions also include instructions to communicate the adjusted cycle life to operate the battery.

In one embodiment, a method for improving the cycling of batteries using data and a HBM for predicting the cycle life of a cycling protocol is disclosed. In one embodiment, the method includes classifying cycle life of a battery into a class using battery data from cycling with a protocol, wherein the class represents cycle life distributions of cycling protocols. The method also includes quantifying, using the class in a HBM, variability for the battery induced by the protocol. The method also includes predicting, using the HBM, an adjusted cycle life for the protocol according to the variability. The method also includes communicating the adjusted cycle life to operate the battery.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Systems, methods, and other embodiments associated with improving the cycling of batteries using data and a hierarchical Bayesian model (HBM) for predicting the cycle life of a new cycling protocol are disclosed herein. A cycling protocol may involve charging, discharging, and so on of a battery according to operating constraints. In various implementations, a prediction system acquires battery data from a battery using a new cycling protocol and constructs features. In one approach, the prediction system may use a new feature $\Delta V$ constructed from the battery data and other data from electrochemical cycling for improved performance with constant-current and variable-current cycling. In addition, the $\Delta V$ feature may allow the HBM to predict the performance or the cycle life of the new cycling protocol without extracting various other features from the battery data. In this way, the prediction system may use the $\Delta V$ feature to reduce complexity for testing or operating the battery by using fewer features.

Furthermore, a classifier may determine a class and a cycle life projected by a prediction model using the battery data or the $\Delta V$ feature. The cycle life of a battery may represent the number of cycles, such as charging cycles, until a maximum charge and other performance parameters degrade due to wear. Furthermore, the class may represent cycle life distributions of cycling protocols used by the prediction model. For example, the class may indicate long cycle life, short cycle life, and so on of the new cycling protocol associated with the distributions and grouping of cycle life from other cycling protocols. However, due to variabilities between batteries and cycling protocols, confidence in the classification may vary depending on the cycling protocol and battery pairing.

Moreover, the HBM may make adjustments to improve inaccuracies by the classifier and prediction of the cycle life, such as those from variability, using a few observations. In particular, the HBM may quantify the variabilities using different levels for cycle life distributions, battery variability measured by other cycling protocols, and the total cycle distributions of other cycling protocols in a hierarchy. In one approach, the hierarchy may relate to accuracy or confidence requirements for the cycle life associated with the battery. As such, the HBM may make inferences to predict an adjusted cycle life for the new cycling protocol according to the different levels. The cycle life is adjusted by accounting for variabilities among batteries, cycling protocols, and cycle life distributions in just a few observations. Thus, the HBM accelerates testing without repeated measurements while improving accuracy, thereby improving development time and reducing costs.

Figure 1:
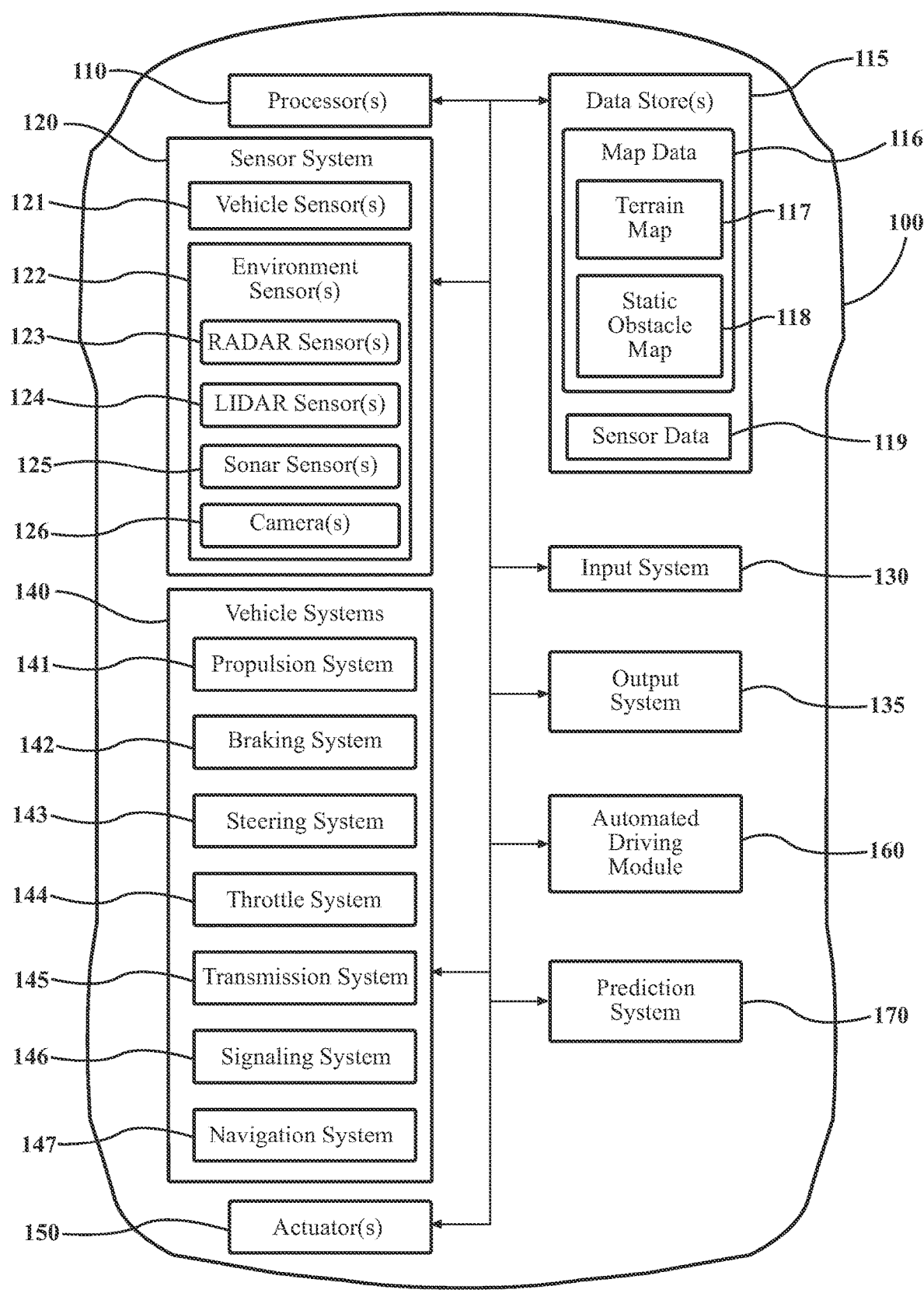
FIG. 1 illustrates one embodiment of a vehicle within which systems and methods disclosed herein may be implemented.

Now referring to FIG. 1, an example of a vehicle 100 is illustrated. As used herein, a "vehicle" is any form of motorized transport. In one or more implementations, the vehicle 100 is an automobile. While arrangements will be described herein with respect to automobiles, it will be understood that embodiments are not limited to automobiles. In some implementations, the prediction system 170 may be used for consumer electronics (CE), mobile devices, robots, drones, and so on that benefit from the functionality discussed herein associated with a manner of improving the cycling of batteries using data and a Bayesian model for predicting the cycle life of a new cycling protocol.

The vehicle 100 also includes various elements. It will be understood that in various embodiments, the vehicle 100 may have less than the elements shown in FIG. 1. Further, the elements shown may be physically separated by large distances. For example, as discussed, one or more components of the disclosed system can be implemented within a vehicle while further components of the system are implemented within a cloud-computing environment or other system that is remote from the vehicle 100.

Some of the possible elements of the vehicle 100 are shown in FIG. 1 and will be described along with subsequent figures. However, a description of many of the elements in FIG. 1 will be provided after the discussion of FIGS. 2-6 for purposes of brevity of this description. Additionally, it will be appreciated that for simplicity and clarity of illustration, where appropriate, reference numerals have been repeated among the different figures to indicate corresponding or analogous elements. In addition, the discussion outlines numerous specific details to provide a thorough understanding of the embodiments described herein. Those of skill in the art, however, will understand that the embodiments described herein may be practiced using various combinations of these elements.

As will be discussed in greater detail below, the prediction system 170, in various embodiments, may be implemented partially within a CE device, a mobile device, a robot, a drone, a vehicle and so on and as a cloud-based service. For example, in one approach, functionality associated with at least one module of the prediction system 170 is implemented within a certain device while further functionality is implemented within a cloud-based computing system.

Figure 2:
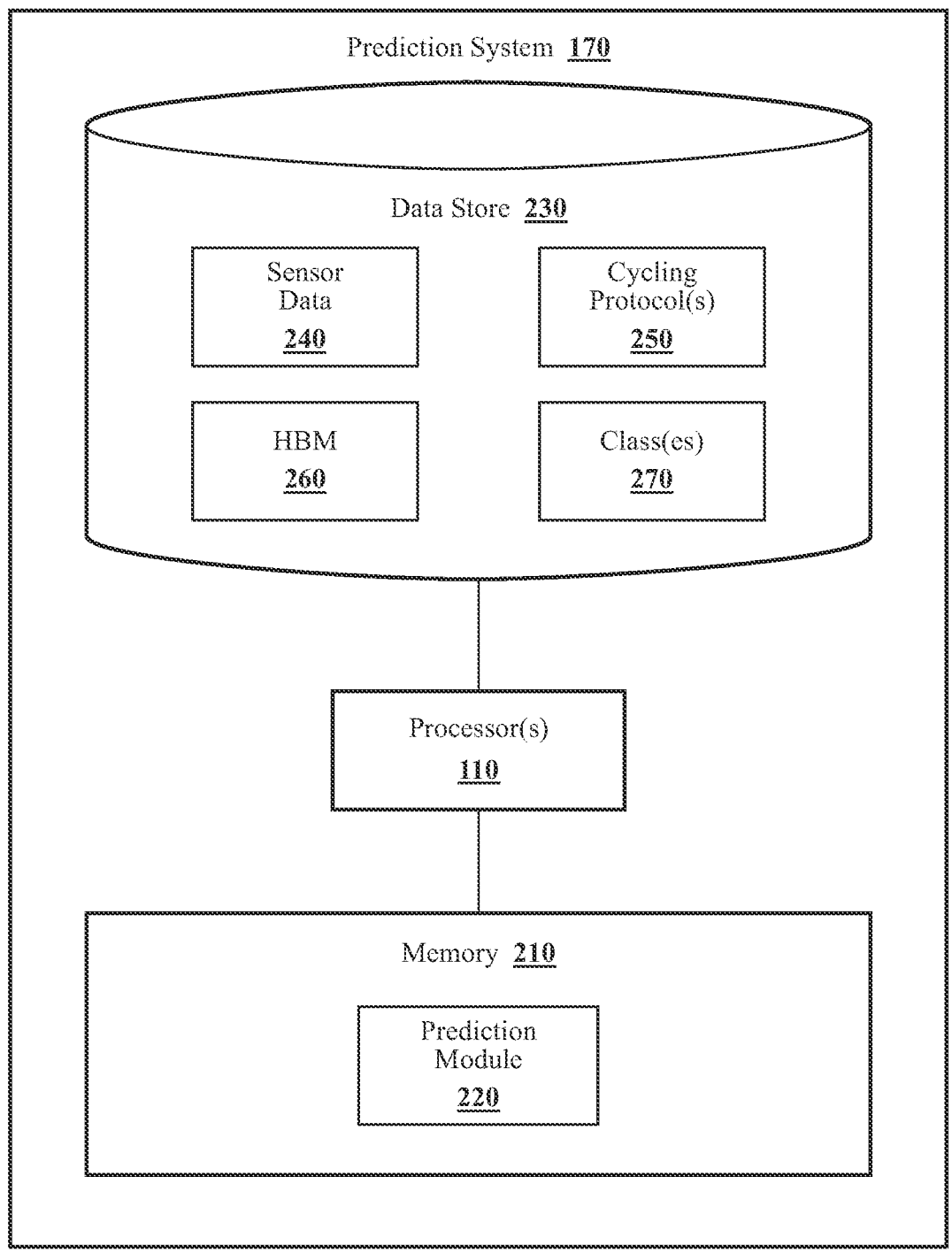
FIG. 2 illustrates one embodiment of a prediction system that is associated with improving predictions associated with cycling protocols of batteries using data and a hierarchal Bayesian model (HBM).

With reference to FIG. 2, one embodiment of the prediction system 170 is illustrated. The prediction system 170 is shown as including a processor(s) 110 from the vehicle 100 of FIG. 1. However, in other examples, the processor(s) 110 may be part of a CE device, a mobile device, a robot, a drone, and so on. Accordingly, the processor(s) 110 may be a part of the prediction system 170, the prediction system 170 may include a separate processor from the processor(s) 110, or the prediction system 170 may access the processor(s) 110 through a data bus or another communication path. In one embodiment, the prediction system 170 includes a memory 210 that stores a prediction module 220. The memory 210 is a random-access memory (RAM), read-only memory (ROM), a hard-disk drive, a flash memory, or other suitable memory for storing the prediction module 220. The prediction module 220 is, for example, computer-readable instructions that when executed by the processor(s) 110 cause the processor(s) 110 to perform the various functions disclosed herein.

Furthermore, the prediction system 170 as illustrated in FIG. 2 is generally an abstracted form of the prediction system 170 as may be implemented locally, in a cloud-computing environment, or both. For instance, the prediction system 170 may be at least in part within a cloud-computing environment.

With reference to FIG. 2, the prediction module 220 generally includes instructions that function to control the processor(s) 110 to receive data inputs from sensors or other components. As provided for herein, the prediction module 220, in one embodiment, may acquire sensor data 240 from a battery, a battery pack, a battery management system (BMS), a battery cell(s), and so on through testing or regular cycling. For example, the prediction system 170 may test a battery according to engineered or constructed operating parameters related to voltage, charge levels, capacity, and so on. Furthermore, a test may also measure current drawn from a device for a particular voltage level. More details on testing or diagnostics for a battery are given below.

In addition, the prediction module 220, in one embodiment, controls respective sensors to provide the data inputs in the form of the sensor data 240. Moreover, the prediction module 220 can undertake various approaches to iteratively acquire and/or fuse data from multiple sensors when providing the sensor data 240 and/or from sensor data acquired over a wireless communication link.

Moreover, in one embodiment, the prediction system 170 includes a data store 230. In one embodiment, the data store 230 is a database. The database is, in one embodiment, an electronic data structure stored in the memory 210 or another data store and that is configured with routines that can be executed by the processor(s) 110 for analyzing stored data, providing stored data, organizing stored data, and so on. Thus, in one embodiment, the data store 230 stores data used by the prediction module 220 in executing various functions. Also, the data store 230 may include the cycling protocol(s) 250, HBM 260, and class(es) 270. As explained further below, the prediction system 170 may use the cycling protocol(s) 250 in the HBM 260 for the prediction of performance for a battery or battery cell(s). The cycling protocol(s) 250 may relate to charging, discharging, formation cycling, evaluations, measurements, parameterization, operating envelopes, testing, and so on of a battery for operation or diagnostics. In one approach, a new or updated cycling protocol may define operating constraints for a battery in the vehicle 100, a CE device, a mobile device, a robot, a drone, and so on. Also, in various implementations, to address degradation from operation a device may use the sensor data 240 to optimize the cycling protocols(s) 250 to reduce electrochemical degradation of the battery.

Regarding the HBM 260 and class(es) 270, the prediction system 170 may use the HBM 260 for probabilistic inferences and learning over hierarchies of knowledge, such as cell-to-cell and between-protocol variability. As explained below, the HBM 260 may use information from a prediction model that classifies a cycling protocol according to cycle life using machine learning (ML) and the acquired data from a few observations. Examples of the classes 270 may be low-cycle, medium-cycle, high-cycle, good, bad, and so on life in relation to cycling a battery. In one approach, the prediction model may classify data from the cycling protocol using the class(es) 270 based on the charging and voltage relationship during an initial or predetermined set of battery cycles (e.g. 1, 2, 3).

More details will now be given for the prediction module 220. In one embodiment, the prediction module 220 is further configured to perform additional tasks beyond controlling the respective sensors to acquire and provide the sensor data 240. For example, the prediction module 220 may include instructions that cause the processor(s) 110 to quantify the variability of a battery using a new, updated, or initialized cycling protocol by applying a class of the cycling protocol in the HBM 260 to predict the cycle life. The class may be any one of the classes 270. For prediction, the HBM 260 may learn the cycle life of a new cycling protocol in association with the class. The HBM 260 may also derive the abstract knowledge describing the degree of cell-to-cell variability of cycle life among different protocols and cycle life distributions for cycling protocols to infer the performance of a new cycling protocol from a few observations with more accuracy. As further explained in FIGS. 5(a) and 5(b), the HBM 260 may capture the abstract knowledge through the learning of battery parameters at several levels of abstraction.

Now considering ML, the prediction system 170 may use a ML model, such as a regression model (e.g., elastic net, Gaussian process regression) or a classification model (e.g., support vector machine, minimax probability machine), as part of a prediction model for classifying data acquired from the new cycling protocol on the battery. The prediction system 170 for classifying cycling protocols using ML will be described further below. Of course, in further aspects, the prediction system 170 may employ different ML algorithms or implements different approaches for performing the associated functions.

Before moving on to FIG. 3, a brief introduction to the method 300 prior to the discussion of the explicitly identified functions will be given. The prediction system 170 may combine predicting the cycle life, according to a class related to a new cycling protocol, with the HBM 260 to rapidly predict the performance of the new cycling protocol without repetitive testing of a battery. Through hierarchical learning, the HBM 260 may also adjust for attributes that vary significantly between categories (e.g. different batteries), as well as features that may be homogenous within categories (e.g. same battery) in a dataset for the new cycling protocol. As explained below, the HBM 260 also adjusts for uncertainties of prediction models that classify or group a cycling protocol. In this way, combining cycle life predictions with the HBM 260 allows earlier prediction of cycle life for a cycling protocol by relying on a few observations of the battery.

Further describing improvements, the method 300 also reduces time and costs of testing cycling protocols on a battery due to increased dimensionality of a parameter space or manufacturing variability. A parameter space may be a set of physical or chemical properties tested or observed for a particular battery. The dimensionality may be increased in that the size of the parameter space associated with cycling protocols becomes larger as the relative number of experimental evaluations increases. The manufacturing variability may increase complexity since the combination of parameters can substantially vary over time for a battery. The variance of the battery or battery cells may be due to exogenous factors, particularly during early development of new technologies and materials. However, combining cycle life predictions according to the classification of a cycling protocol with the HBM 260 accounts for the dimensionality and manufacturing variability for different batteries.

Now, additional aspects of combining the classifications of a new or updated cycling protocol with the HBM 260, or similarly to HBM 420 as explained below, will be discussed in relation to FIG. 3. FIG. 3 illustrates a flowchart of a method 300 that is associated with improvements for predicting the cycle life of the new or updated cycling protocol for a battery using the HBM 260. Method 300 will be discussed from the perspective of the prediction system 170 of FIGS. 1, and 2. While method 300 is discussed in combination with the prediction system 170, it should be appreciated that the method 300 is not limited to being implemented within the prediction system 170 but is instead one example of a system that may implement the method 300.

At 310, the prediction system 170 classifies the cycle life of a battery using data from cycling with a protocol. Although the example is given for one cycling protocol, multiple cycling protocols may be tested for performance predictions in a few cycles or time than individual protocols. The protocol may be a cycling protocol that is new, updated, or initialized for a battery. In addition, the cycling protocol may be one of cycling protocol(s) 250 that relates to charging, discharging, formation cycling, evaluations, measurements, parameterization, operating envelops, testing, and so on of a battery for operation or diagnostics. A cycling protocol may be associated with a charge profile, discharge profile, temperature dissipation, current parameters, heating property, or the like that effects or controls the operation of the battery. As such, a cycling protocol may define operating constraints for a battery. For example, a cycling protocol for charging may be associated with a $\Delta V$ feature related to a charging voltage compared to a capacity profile or model for a battery. As explained below, $\Delta V$ may be a new feature constructed or engineered from battery data acquired for a new cycling protocol to predict the cycle life. Similarly, a discharging $\Delta Q$ feature may be related to a profile or model for a discharging voltage for a battery. In certain applications, the classification of a charging protocol may particularly be useful to prevent damage of the battery by the cycling protocol.

Moreover, the prediction system 170 uses data acquired from the battery for the cycling protocol in a prediction model for classification. As explained further below, the classification may involve using a rich dataset from the induced reactions of various batteries, by different protocols representing a diverse distribution, to train the prediction model. For example, a particular charging protocol may have a distribution of cycle life spanning 800-950 cycles using continuous current and according to other parameters. Using distribution information, the prediction model may classify batteries into low-cycle, medium-cycle, high-cycle, good, bad, and so on life groups after a few cycles to reduce overall testing time related to a cycling protocol. Furthermore, the prediction system 170 may construct or engineer features based on transformations of (e.g., the minimum, variance, mean of square) of $\Delta V(Q)$, cycle-to-cycle evolution of charge $V(Q)$, etc.

At 320, the prediction system 170 quantifies variability for the battery induced by the protocol using the classification in the HBM 260. Classification by the prediction model alone may not explicitly or accurately account for cell-to-cell variability without repeated measurements. As explained below, the HBM 260 uses parameters $\alpha$ and $\beta$ defined in Equations (6) and (7) to quantify the variability and make adjustments accordingly for predictions. As such, the HBM 260 may increase accuracy while reducing both the testing time and total testing required for new or updated cycling protocols on a battery.

Figure 4:
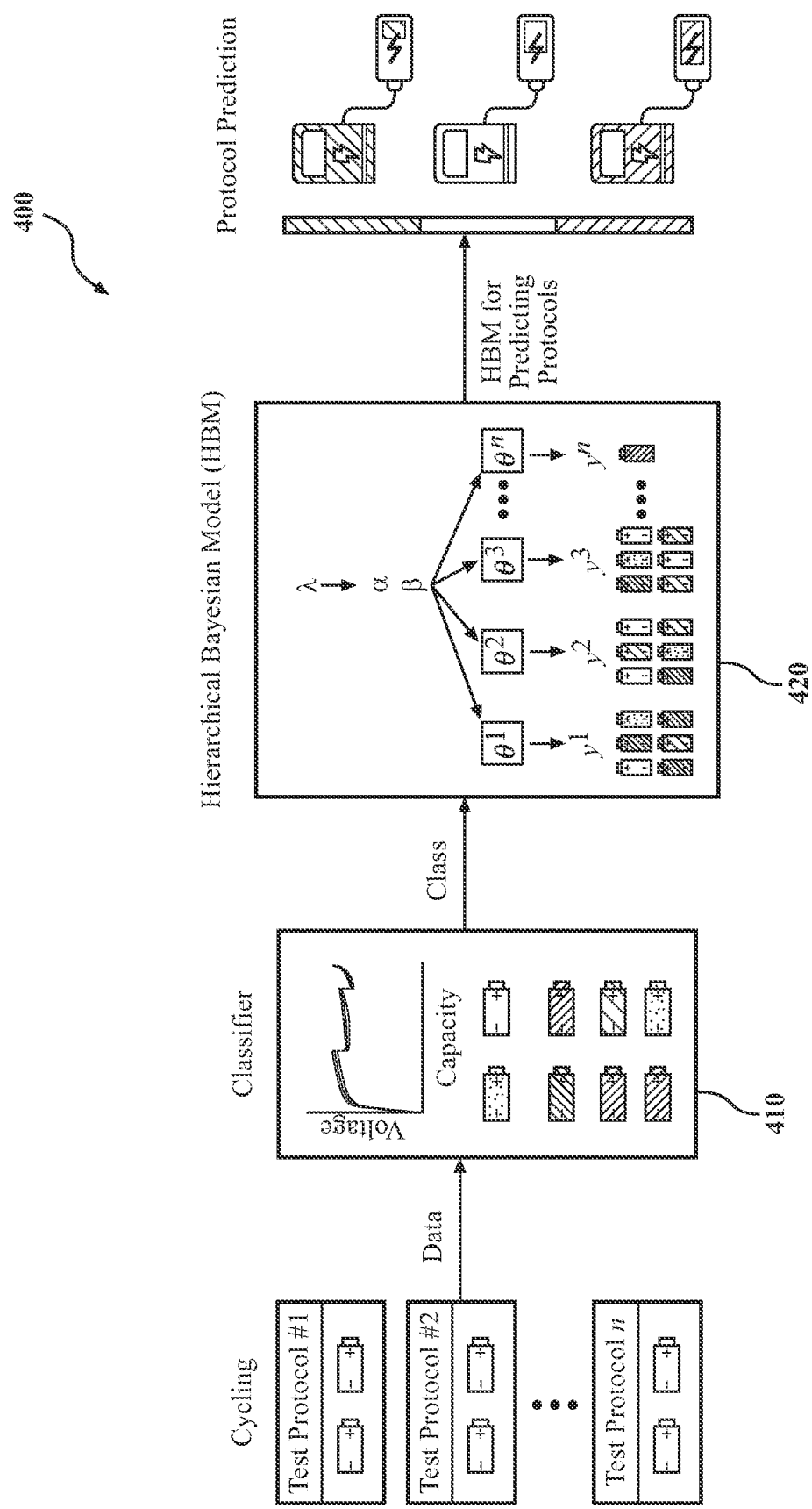
FIG. 4 illustrates one embodiment of acquiring data and applying the HBM using classifications for predictions associated with a cycling protocol for a battery.

Regarding more details on classification, a system 400 in FIG. 4 uses a classifier 410 that outputs a class according to the battery for a new or updated cycling protocol. The class may indicate long cycle life, short cycle life, and so on for the battery according to data from the cycling protocol. The HBM 420, like the HBM 260, may use the class(es) to identify a discrete distribution to draw inferences for cycle life associated with the cycling protocol. In particular, the HBM 420 shows a hierarchy and applications related to method 300 for cycling protocols. The variable $y^i$ may indicate data from observations of cycling protocol i for the HBM 420. In one approach, the method 300 uses the HBM 420 in predicting the cycle life distribution (i.e., θn) of a new cycling protocol—protocol n—using a few measurements. The HBM 420 may draw inferences using knowledge from two levels of the hierarchy. One level may be the concrete (level-1) knowledge about the cycle life distribution of a training cycling protocol ($\theta^i$ indicates the cycle life distribution for the $i^{th}$ protocol), which explains the data and supports the ability of the inference. The abstract (level-2) knowledge may describe the knowledge of cycle life variability among protocols and overall distribution of cycle life for those cycling protocols.

Regarding level-2, the HBM 420 may represent the knowledge using two parameters $\alpha$ and $\beta$ defined below in Equations (6) and (7). The parameter $\alpha$ may capture the extent of cycle life in a cycling protocol that may be uniform or the degree of cell-to-cell variability associated with cycle life. The parameter $\beta$ may indicate the average distribution cycle life across all cycling protocols for a given battery. Furthermore, the HBM 420 may use level-3 knowledge that represents the prior expectations of cycling protocols in general to make further adjustments associated with predictions. Accordingly, the high-order abstract knowledge of the HBM 420 allows forming a reasonable profile of the new or updated cycling protocol from only a few observations.

Now considering computations, the HBM 420 may compute the posterior distribution $p(\alpha,\beta,\{\theta^i\}|y)$ for inferences and predictions of the cycling protocol. As such, the HBM 420 simultaneously obtains level-2 knowledge about a and β and level-1 knowledge about the cycle life distribution $\theta^i$, i=1, 2, . . . , of individual cycling protocols. Inferences about θ', the cycle life distribution of cycling protocol i, can be marginalized out of the posterior distribution over (a, ft) according to Equation (8) below. Accordingly, the HBM 420 may simplify the computation of complex distributions of cycle life for a cycling protocol applied to a battery by addressing uncertainties from the classifier 410.

Furthermore, the HBM 420 may compute the distribution according to training using a fixed or variable dataset. For example, the dataset may include results of twenty one different cycling protocols tested with varying repetitions across seventy three batteries to train the HBM 420. In one approach, the HBM 420 can learn the level-1 knowledge of $\theta^i$ as well as the level-2 knowledge of $(\alpha,\beta)$ according to the dataset. From a certain perspective, the HBM 420 may map a cycling protocol to produce inferences on future performance associated with a battery or battery cell(s) using classifications from only a few measurements.

Now returning to FIG. 3, at step 330 the prediction system 170 predicts a cycle life of the protocol according to the variability. In one example, the HBM 420 may predict the cycle life as follows. After applying a new or updated cycling protocol to one or more batteries, the classifier 410 may classify batteries into k=2 groups according to cycle life. For example, a long-life may be equal to or above 900 cycles whereas a short-life is below 900. The prediction system 170 may apply the HBM 420 to compute the predicted probability distribution of short-lived $p(\theta[1]|y^{new})$ and long-lived $p(\theta[2]|y^{new})$ of the batteries tested. In this example, only one battery is tested and observed as being either short-lived ($y^{new}=[1,0]$) or long-lived ($y^{new}=[0,1]$), where $\theta[j]$, j=1, 2 are the proportions of batteries in group 1 (short-lived) and group 2 (long-lived) generated from a new cycling protocol respectively, and $y^{new}$ indicates a set of observations of battery cycle life from a new cycling protocol. Accordingly, the cycle life of a new or updated cycling protocol may be computed using Equation (10) after few observations as having a good performance with a high confidence level.

At 340, the prediction system 170 determines whether the predicted cycle life for the cycling protocol according to the HBM 420 satisfies criteria. This operation may confirm that the HBM 420 predicted, as described above, or adjusted the cycle life within acceptable degrees. For example, a criterion may be statistical confidence of the HBM 420 results after x observations or measurements. In another approach, a criterion may be a degree of confidence associated with a probability distribution function of a class determined for a cycling protocol. In this way, the determined performance of a cycling protocol is verified before application on a battery.

At 350, the prediction system 170 communicates the predicted cycle life to operate or control the battery if the criteria are satisfied. In one approach, the predicted cycle life may be a cycle life adjusted by the HBM 420 to account for the variability of batteries and cycling protocols. Regarding operation, a device may cycle a battery using a cycling protocol when an adjusted cycle life satisfies criteria for total cycles until degradation to meet performance metrics. By combining the classifications of a new or updated cycling protocol with the HBM 420, the new or updated cycling protocol is applied with a high level of confidence to meet the performance requirements of the battery. Otherwise, the method 300 may return to 310 for another iteration since the new or updated cycling protocol may be a poor match, the battery is defective, more observations are needed, and so on.

For more details on FIG. 4, the system 400 illustrates one embodiment of acquiring data and using classifications with the HBM 420 for predictions associated with cycling protocols on a battery. In system 400, the prediction system 170 may acquire data at initialization or early cycles for a new or updated cycling protocol. Using the method 300, the prediction system 170 makes estimates without wear or cycling a battery to failure. In one approach, the prediction system 170 may achieve early prediction by engineering new feature $\Delta V$ for charging according to acquired data from a battery. The feature $\Delta V$ may have comparable performance to the feature $\Delta Q$ for data from constant-current cycling, while also performing well for data from variable-current cycling. More will be discussed on $\Delta V$ below.

Regarding the classifier 410, the prediction system 170 using the HBM 420 may operate without substantial reliance on data distributions to classify batteries into either short-lived or long-lived battery groups for thresholds of cycle life that vary. The prediction system 170 may also do so using a few observations, measurements, or cycles of a battery thereby saving time and costs. Using the method 300, the HBM 420 prediction may be more accurate with new feature $\Delta V$ than with a plurality of other features, thereby reducing complexity. In particular, $\Delta V$ features during charging may capture the electrochemical evolution of individual cells for improved prediction. Because charging voltage curves contain rich information about degradation, especially in the graphite anode of a battery, the data transformation on voltage curves $\Delta V$ (Q) between cycles may improve the accuracy of the classifier 410 according to the rich information. Here, Q may be the charge or capacity of a battery or battery cell(s).

Furthermore, the prediction system 170 can take advantage of correlations associated with feature $\Delta V$ to improve predictions. For instance, the voltage difference using $\Delta V$ between two given cycles a and b may be substantially correlated with internal resistance buildup for the same composition and temperature. The classifier 410 and HBM 420 may also rely on the integral of the curve $\Delta V$ (Q) between cycles to improve prediction accuracy. The prediction system 170 may use the correlation and integral data to improve the classification of cycling protocols. Accordingly, using engineered features such as $\Delta V$ on early-cycle data with the classifier 410 and the HBM 420 results in accurate predictions for a new or updated cycling protocol(s) thereby reducing costs, damaged batteries, and testing time.

For further details on accuracy, the performance of the HBM 420 may be related to the number of observations (n) and the cell-to-cell variability degree (a) for different class groups according to the decision rule of Equation (9). When the variability degree a is small (e.g., a is near 0) the first observation may indicate a reliable prediction result for a new or updated cycling protocol. Thus, further observations are unnecessary. As the variability degree a increases, the prediction system 170 may use more observations for accuracy.

Regarding more details of the computation, in certain approaches the HBM 420 may use a Dirichlet-multinomial model. Forthcoming are details of the derivation of the HBM 420 through Equations (1)-(10) to quantify or reduce variability due to the classification of a new or updated cycling protocol and predict the performance on a battery from a few observations. As an example of the computation, the prediction system 170 may use a set of k groups and variables initially defined for k=2. Assuming $\theta^i$ indicates a true cycle life distribution of a battery for the $i^{th}$ cycling protocol, if 30% of the batteries from cycling protocol 4 are short-lived, then $\theta^4=[0.3, 0.7]$. Furthermore, $y^i$ may indicate observations of a cycle life from cycling protocol i. If the prediction system 170 acquires six samples from cycling protocol 4 and all batteries but one sample is short-lived, then $y^4=[5, 1]$.

Moreover, the prediction system 170 may observe data from cycling protocols as $y=\{y^1, y^2, \ldots\}$, where $y^i$, i=1, 2, ..., is the data observations of a battery from cycling protocol i. The prediction system 170 may assume that $y^{new}$ is drawn from a multinomial distribution with parameter $\theta^i$ so that cycle life responsible for the observations in that $y^i$ are drawn independently and randomly from the $i^{th}$ cycling protocol. Thus, a cycle life may depend on the distribution $\theta^i$ for a particular cycling protocol performed on a battery.

In one approach, the cycle life of a cycling protocol may be expressed as, $$p(y) = \Pi_i p(y^i | n^i) \quad \text{Equation (1)}$$

and $$P(y^i | n^i) \sim \text{Multinomial}(\theta^i) \quad \text{Equation (2)}$$

where $n^i$ is the number of observations for cycling protocol i. The vectors $\theta^i$, i=1, 2, ..., are assumed to be drawn from a Dirichlet distribution parameterized by a vector $\gamma=[\gamma_1, \gamma_2, \gamma_k]^T$, which is described by $$p(\theta^i) \sim Dir(\theta \mid \gamma) = \frac{1}{B(\gamma)} \prod_{j=1}^{k} \theta_j^{\gamma_j - 1}. \quad \text{Equation (3)}$$

In Equation (3), the variables are defined as, $$B(\gamma) \triangleq \prod_{j=1}^{k} \Gamma(\gamma_j) / \Gamma(\gamma_0) \quad \text{Equation (4)}$$

and $$\gamma_0 \triangleq \sum_{j=1}^{k} \gamma_j. \quad \text{Equation (5)}$$

Regarding the definitions, $$\alpha = \gamma_0 / k = \sum_{j=1}^{k} \gamma_j / k \quad \text{Equation (6)}$$

and $$\beta = [\beta_1, \beta_2, \ldots, \beta_k]^T \text{ with } \beta_j = \gamma_j / \gamma_0 \quad \text{Equation (7)}$$

Figure 3:
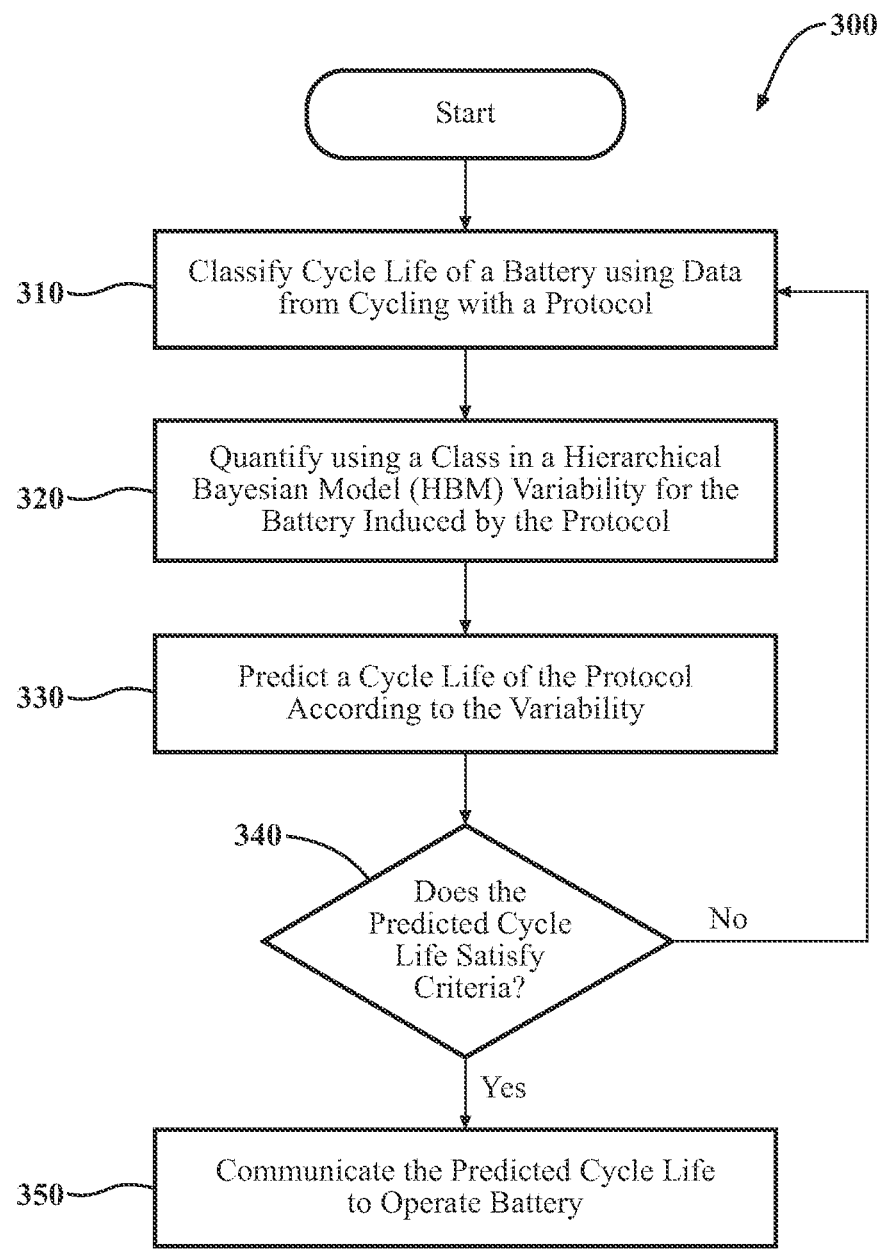
FIG. 3 illustrates one embodiment of a method that is associated with combining the classifications of cycling protocols with the HBM to predict the cycle life of a cycling protocol for a battery.

As referenced above in FIG. 3, the parameter $\alpha$ may indicate the overall degree of cell-to-cell variability of cycle life among different cycling protocols and $\beta$ represents the distribution of cycle life across a collection of cycling protocols. In one approach, the prediction system 170 may use a uniform distribution on $\beta$ and an exponential distribution on $\alpha$ to capture a weak prior expectation that the batteries from any cycling protocol may have a uniform cycle life. In HBM 420, the mean of the exponential distribution is $\lambda$ (e.g., $\lambda=1$).

Accordingly, the prediction system 170 may obtain the posterior distribution $p(\alpha,\beta,\{\theta^i\}|y)$ (or $p(\gamma,\{\theta^i\}|y)$) through multiplying the likelihood in Equation (1) by the prior in Equation (3). In one approach, the prediction system 170 may maximize the posterior distribution $p(\alpha,\beta,\{\theta^i\}|y)$ to simultaneously learn level-2 knowledge about $\alpha$ and $\beta$ and level-1 knowledge about the cycle life distribution $\theta^i$ of a cycling protocol i. Accordingly, the predictions system 170 may compute predictions for a cycling protocol by estimating $p(\alpha,\beta|y)$ using the Markov chain-Monte Carlo method. Inferences about the $\theta^i$ may then be computed by integrating over $\alpha$ and $\beta$, $$p(\theta^i|\gamma) = \int_{\alpha,\beta} p(\theta^i|\alpha,\beta,y) p(\alpha,\beta|y) d\alpha d\beta. \quad \text{Equation (8)}$$

A category of cycling protocol i can be classified as, $$j = \arg\max_{j=1,\ldots,k} \{p(\theta^i[j] > 1/k)\} \quad \text{Equation (9)}$$

where $p(\theta^i[j] > 1/k)$ is the summation of the probabilities in which the $\theta^i[j]$ are larger than $1/k$, and k is the division number of cycle life groups. Therefore, the cycle life of cycling protocol i can be calculated as, $$\hat{z}_i = \sum_{j=1}^{k} p(\theta^i[J] > 1/k) \times m_j \quad \text{Equation (10)}$$

where $\hat{z}_i$ is the estimated cycle life of the $i^{th}$ cycling protocol and $m_j$ is the median cycle life of the $j^{th}$ cycle life group.

Now considering error in the predictions, the prediction system 170 may use metrics of average percent error and root-mean-squared error (RMSE) to evaluate performance. The average percent error may be defined as $$\frac{1}{N} \sum_{i=1}^{N} \frac{|z_i - \hat{z}_i|}{z_i} \times 100 \quad \text{Equation (11)}$$

where $z_i$ is the mean of the observed cycle life for the $i^{th}$ cycling protocol from multiple experiments and N is the total number of tested cycling protocols. RMSE is defined as, $$RMSE = \sqrt{\frac{1}{N} \sum_{i=1}^{N} (z_i - \hat{z}_i)^2}. \quad \text{Equation (12)}$$

Regarding commercial applications, the system 400 may be utilized for battery warranties. For example, a warranty provider may use the results of method 300 indicating two good cycling protocols but predicting for 90% of batteries to be long-lived and another for 95% to be long-lived for warranty decisions. The warranty provider may perform further tests to determine the relationship between the number of observations, the cell-to-cell variability, and the confidence in the distribution of cycle life predicted for determining battery failure.

Moreover, the warranty provider or manufacturer may utilize the quantification of variability to predict failure rates before meeting the threshold for cycle life. This may be used to determine the cost of a warranty or battery for a given threshold by explicitly considering cell-to-cell variability observed in the training data. In one approach, a battery reseller may also use the variability in cycle life (e.g. a) for pricing. Thus, results of the system 400 may be used to improve business decisions for a battery.

Figure 5A:
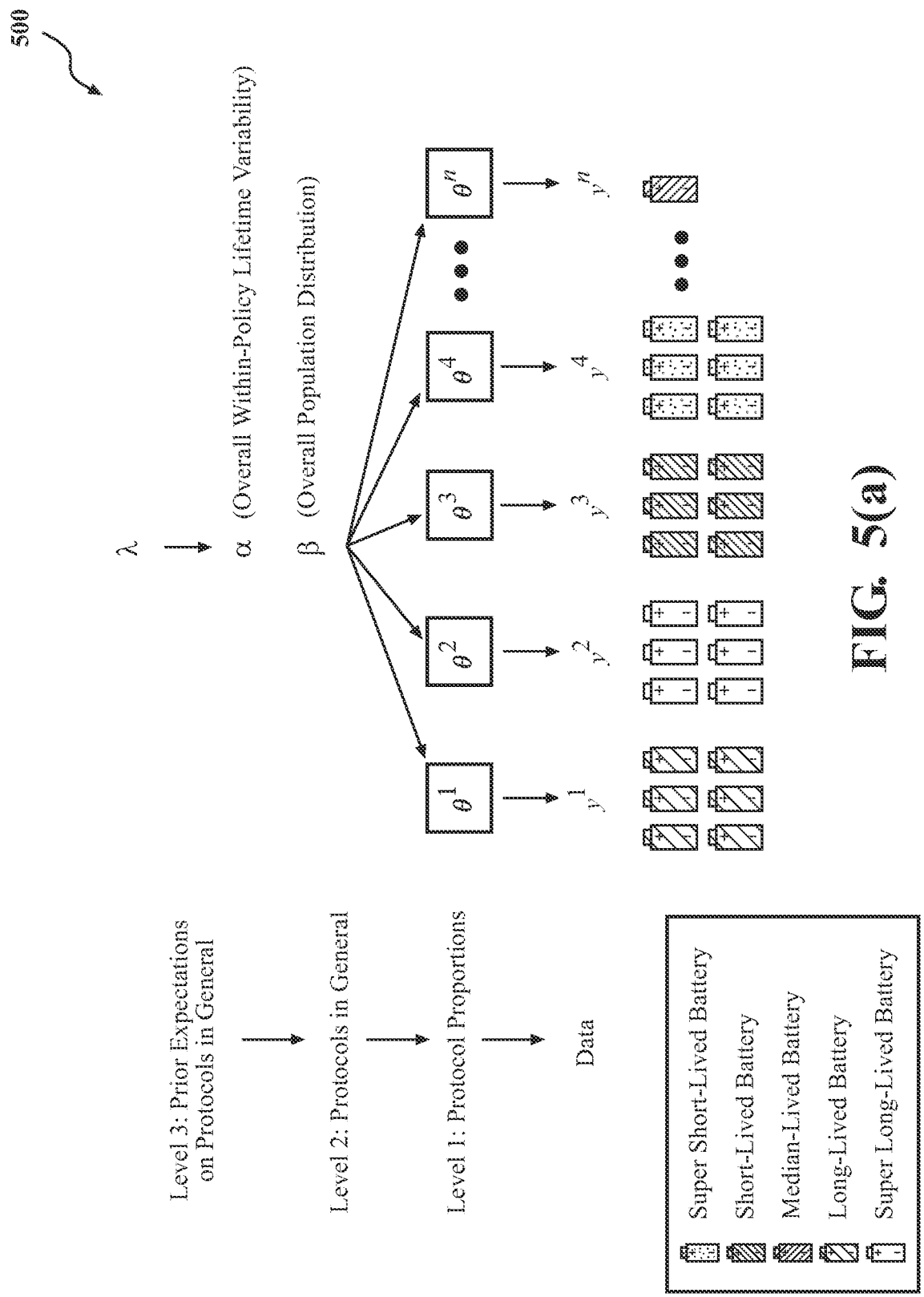
FIG. 5(a) and FIG. 5(b) illustrate a hierarchy used in the HBM to predict the cycle life of a cycling protocol for a battery accounting for variations.
Figure 5B:
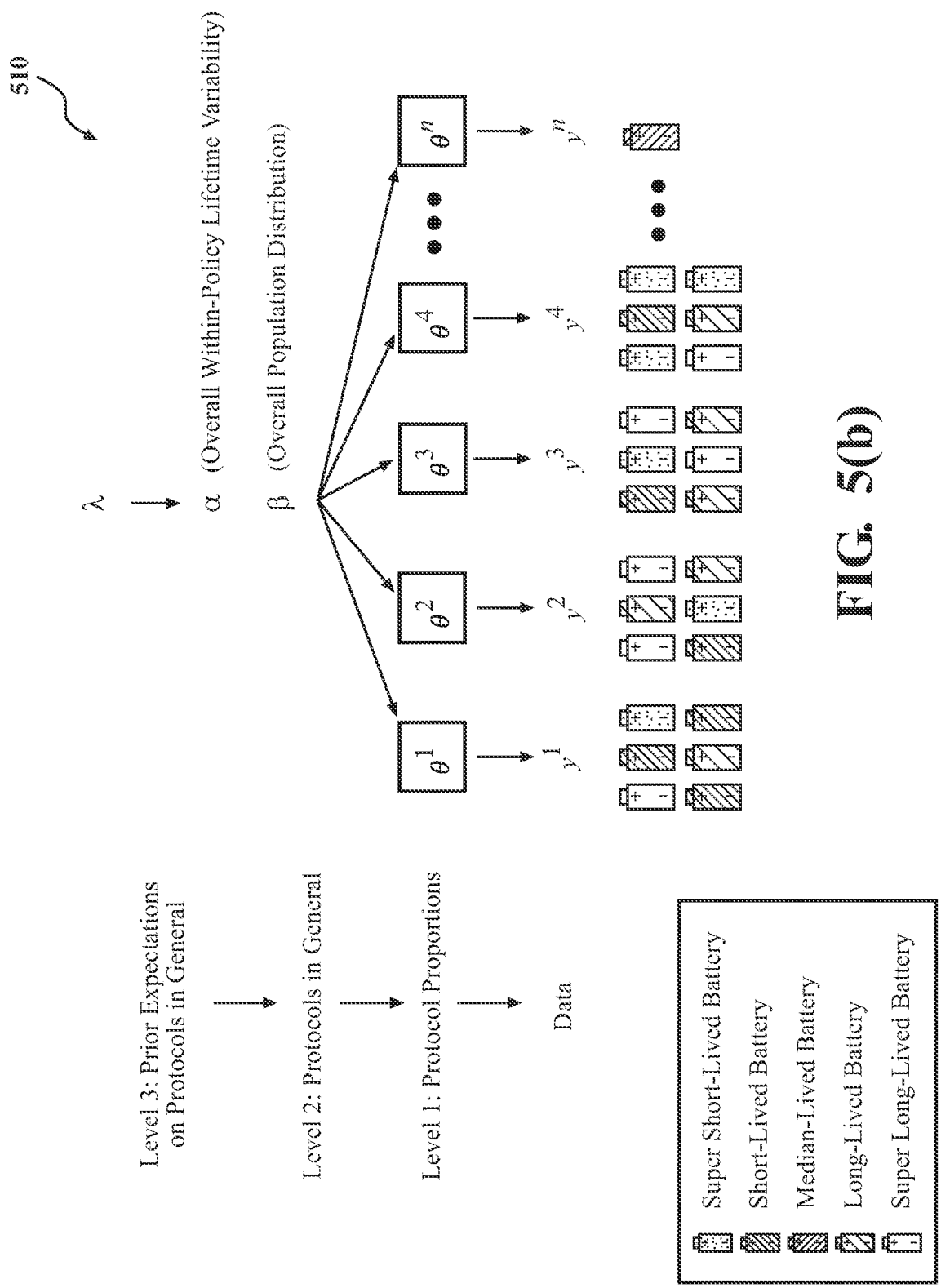

FIG. 5(a) and FIG. 5(b) illustrate a hierarchy used in the HBM 260 or 420 to predict the cycle life of cycling protocols for a battery accounting for variations. FIG. 5(a) and FIG. 5(b) show batteries having varying cycle lives from different cycling protocols where different patterns indicate different groups of cycle life. The hierarchy for the HBM 260 or 420 in 500 and 510 is similar to that described above. In one approach, 500 or 510 may include a stack containing many cycling protocols for batteries. The prediction system 170 may include samples from several cycling protocols where some comprise short-lived and super-long-lived batteries, while others contain long-lived and super-short-lived batteries.

The prediction system 170 may then have a new or updated cycling protocol—protocol n—draw a single sample, and observe that the sample is a median-lived (blue) battery. The prediction system 170 and system 400 attempt to predict the cycle life distribution (i.e., θn) of the new or updated cycling protocol with few observations. A single or few observations provides sparse information about the new or updated cycling protocol. However, the HBM 260 can use the outcomes of the previous cycling protocols and classifications for inferences, learning, and accurate predictions. For example, FIG. 5(*a*) shows that the cycle life of batteries in a cycling protocol may be uniform (i.e. α=0) to infer the hypothesis H that the cycle life of all batteries from the new or updated cycling protocol n are median-lived (blue). In FIG. 5(*b*), a cycling protocol may have large variability of cycle life, and the information α and β at level-2—in which α means the overall degree of cell-to-cell variability and β means the overall cycle life distribution across all cycling protocols—learned from previous cycling protocols is critical for predicting the cycle life distribution (i.e., θ″) when using only few observations.

Figure 6:
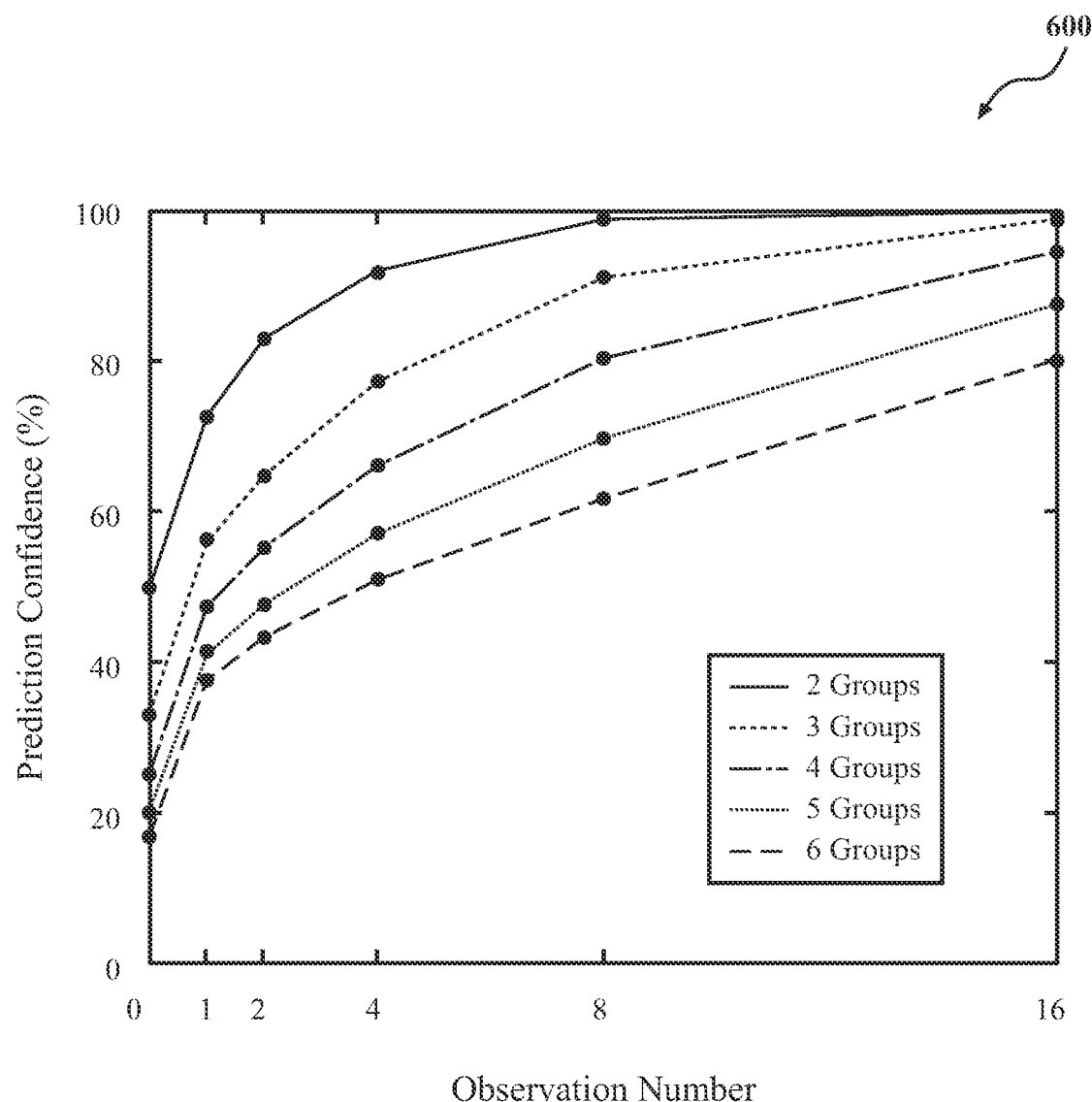
FIG. 6 illustrates simulation results of combining the classifications of cycling protocols with the HBM to predict the cycle life of a cycling protocol using a few observations.

Regarding simulation results, FIG. 6 illustrates the results of combining the classifications of cycling life with an HBM to predict the cycle life of a cycling protocol using a few observations. In chart 600, the results of the prediction performance of the HBM 260, and similarly the HBM 420, as a function of observation number (n) and the cell-to-cell variability degree a are illustrated. In particular, the chart 600 applies to classifying cycling protocols into multiple-protocol groups 2-6. The classification is compared to a prediction confidence of the HBM 260 as a function of observation numbers for the 2-6 groups. Accordingly, by combining the classification of cycle life predictions of a cycling protocol with the HBM 260, the prediction system 170 may achieve substantially 80% confidence within two observations. As such, the majority of prediction accuracy is gained within the first few observations, and subsequent observations only provide marginal improvement. In this way, the prediction system 170 may substantially reduce testing time compared to protocol cycling predictions of cycle life alone by using the HBM 260 for new or updated cycling protocols used on a battery.

Turning now to FIG. 1, an example environment within which the system and methods disclosed herein may operate in the vehicle 100 is disclosed. However, in various implementations, the system and methods may operate as given above in any device such as a CE device, a mobile device, a robot, a drone, a vehicle, a cloud-based service, and so on. The vehicle 100 is configured to switch selectively between different modes of operation/control according to the direction of one or more modules/systems of the vehicle 100. In one approach, the modes include: 0, no automation; 1, driver assistance; 2, partial automation; 3, conditional automation; 4, high automation; and 5, full automation. In one or more arrangements, the vehicle 100 can be configured to operate in a subset of possible modes.

In one or more embodiments, the vehicle 100 is an automated or autonomous vehicle. As used herein, "autonomous vehicle" refers to a vehicle that is capable of operating in an autonomous mode (e.g., category 5, full automation). "Automated mode" or "autonomous mode" refers to navigating and/or maneuvering the vehicle 100 along a travel route using one or more computing systems to control the vehicle 100 with minimal or no input from a human driver. In one or more embodiments, the vehicle 100 is highly automated or completely automated. In one embodiment, the vehicle 100 is configured with one or more semi-autonomous operational modes in which one or more computing systems perform a portion of the navigation and/or maneuvering of the vehicle along a travel route, and a vehicle operator (i.e., driver) provides inputs to the vehicle to perform a portion of the navigation and/or maneuvering of the vehicle 100 along a travel route.

The vehicle 100 can include one or more processors 110. In one or more arrangements, the processor(s) 110 can be a main processor of the vehicle 100. For instance, the processor(s) 110 can be an electronic control unit (ECU), an application-specific integrated circuit (ASIC), a microprocessor, etc. The vehicle 100 can include one or more data stores 115 for storing one or more types of data. The data store(s) 115 can include volatile and/or non-volatile memory. Examples of suitable data stores 115 include RAM, flash memory, ROM, Programmable Read-Only Memory (PROM), Erasable Programmable Read-Only Memory (EPROM), Electrically Erasable Programmable Read-Only Memory (EEPROM), registers, magnetic disks, optical disks, and hard drives. The data store(s) 115 can be a component of the processor(s) 110, or the data store(s) 115 can be operatively connected to the processor(s) 110 for use thereby. The term "operatively connected," as used throughout this description, can include direct or indirect connections, including connections without direct physical contact.

In one or more arrangements, the one or more data stores 115 can include map data 116. The map data 116 can include maps of one or more geographic areas. In some instances, the map data 116 can include information or data on roads, traffic control devices, road markings, structures, features, and/or landmarks in the one or more geographic areas. The map data 116 can be in any suitable form. In some instances, the map data 116 can include aerial views of an area. In some instances, the map data 116 can include ground views of an area, including 360-degree ground views. The map data 116 can include measurements, dimensions, distances, and/or information for one or more items included in the map data 116 and/or relative to other items included in the map data 116. The map data 116 can include a digital map with information about road geometry.

In one or more arrangements, the map data 116 can include one or more terrain maps 117. The terrain map(s) 117 can include information about the terrain, roads, surfaces, and/or other features of one or more geographic areas. The terrain map(s) 117 can include elevation data in the one or more geographic areas. The terrain map(s) 117 can define one or more ground surfaces, which can include paved roads, unpaved roads, land, and other things that define a ground surface.

In one or more arrangements, the map data 116 can include one or more static obstacle maps 118. The static obstacle map(s) 118 can include information about one or more static obstacles located within one or more geographic areas. A "static obstacle" is a physical object whose position does not change or substantially change over a period of time and/or whose size does not change or substantially change over a period of time. Examples of static obstacles can include trees, buildings, curbs, fences, railings, medians, utility poles, statues, monuments, signs, benches, furniture, mailboxes, large rocks, or hills. The static obstacles can be objects that extend above ground level. The one or more static obstacles included in the static obstacle map(s) 118 can have location data, size data, dimension data, material data, and/or other data associated with it. The static obstacle map(s) 118 can include measurements, dimensions, distances, and/or information for one or more static obstacles. The static obstacle map(s) 118 can be high quality and/or highly detailed. The static obstacle map(s) 118 can be updated to reflect changes within a mapped area.

One or more data stores 115 can include the sensor data 119. In this context, "sensor data" means any information about the sensors that the vehicle 100 is equipped with, including the capabilities and other information about such sensors. As will be explained below, the vehicle 100 can include the sensor system 120. The sensor data 119 can relate to one or more sensors of the sensor system 120. As an example, in one or more arrangements, the sensor data 119 can include information about one or more LIDAR sensors 124 of the sensor system 120.

In some instances, at least a portion of the map data 116 and/or the sensor data 119 can be located in one or more data stores 115 located onboard the vehicle 100. Alternatively, or in addition, at least a portion of the map data 116 and/or the sensor data 119 can be located in one or more data stores 115 that are located remotely from the vehicle 100.

As noted above, the vehicle 100 can include the sensor system 120. The sensor system 120 can include one or more sensors. "Sensor" means a device that can detect, and/or sense something. In at least one embodiment, the one or more sensors detect, and/or sense in real-time. As used herein, the term "real-time" means a level of processing responsiveness that a user or system senses as sufficiently immediate for a particular process or determination to be made, or that enables the processor to keep up with some external process.

In arrangements in which the sensor system 120 includes a plurality of sensors, the sensors may function independently or two or more of the sensors may function in combination. The sensor system 120 and/or the one or more sensors can be operatively connected to the processor(s) 110, the data store(s) 115, and/or another element of the vehicle 100. The sensor system 120 can produce observations about a portion of the environment of the vehicle 100 (e.g., nearby vehicles).

The sensor system 120 can include any suitable type of sensor. Various examples of different types of sensors will be described herein. However, it will be understood that the embodiments are not limited to the particular sensors described. The sensor system 120 can include one or more vehicle sensors 121. The vehicle sensor(s) 121 can detect information about the vehicle 100 itself. In one or more arrangements, the vehicle sensor(s) 121 can be configured to detect position and orientation changes of the vehicle 100, such as, for example, based on inertial acceleration. In one or more arrangements, the vehicle sensor(s) 121 can include one or more accelerometers, one or more gyroscopes, an inertial measurement unit (IMU), a dead-reckoning system, a global navigation satellite system (GNSS), a global positioning system (GPS), a navigation system 147, and/or other suitable sensors. The vehicle sensor(s) 121 can be configured to detect one or more characteristics of the vehicle 100 and/or a manner in which the vehicle 100 is operating. In one or more arrangements, the vehicle sensor(s) 121 can include a speedometer to determine a current speed of the vehicle 100.

Alternatively, or in addition, the sensor system 120 can include one or more environment sensors 122 configured to acquire data about an environment surrounding the vehicle 100 in which the vehicle 100 is operating. "Surrounding environment data" includes data about the external environment in which the vehicle is located or one or more portions thereof. For example, the one or more environment sensors 122 can be configured to sense obstacles in at least a portion of the external environment of the vehicle 100 and/or data about such obstacles. Such obstacles may be stationary objects and/or dynamic objects. The one or more environment sensors 122 can be configured to detect other things in the external environment of the vehicle 100, such as, for example, lane markers, signs, traffic lights, traffic signs, lane lines, crosswalks, curbs proximate the vehicle 100, off-road objects, etc.

Various examples of sensors of the sensor system 120 will be described herein. The example sensors may be part of the one or more environment sensors 122 and/or the one or more vehicle sensors 121. However, it will be understood that the embodiments are not limited to the particular sensors described.

As an example, in one or more arrangements, the sensor system 120 can include one or more of: radar sensors 123, LIDAR sensors 124, sonar sensors 125, weather sensors, haptic sensors, locational sensors, and/or one or more cameras 126. In one or more arrangements, the one or more cameras 126 can be high dynamic range (HDR) cameras, stereo, or infrared (IR) cameras.

The vehicle 100 can include an input system 130. An "input system" includes components or arrangement or groups thereof that enable various entities to enter data into a machine. The input system 130 can receive an input from a vehicle occupant. The vehicle 100 can include an output system 135. An "output system" includes one or more components that facilitate presenting data to a vehicle occupant.

The vehicle 100 can include one or more vehicle systems 140. Various examples of the one or more vehicle systems 140 are shown in FIG. 1. However, the vehicle 100 can include more, fewer, or different vehicle systems. It should be appreciated that although particular vehicle systems are separately defined, any of the systems or portions thereof may be otherwise combined or segregated via hardware and/or software within the vehicle 100. The vehicle 100 can include a propulsion system 141, a braking system 142, a steering system 143, a throttle system 144, a transmission system 145, a signaling system 146, and/or a navigation system 147. Any of these systems can include one or more devices, components, and/or a combination thereof, now known or later developed.

The navigation system 147 can include one or more devices, applications, and/or combinations thereof, now known or later developed, configured to determine the geographic location of the vehicle 100 and/or to determine a travel route for the vehicle 100. The navigation system 147 can include one or more mapping applications to determine a travel route for the vehicle 100. The navigation system 147 can include a global positioning system, a local positioning system, or a geolocation system.

The processor(s) 110, the prediction system 170, and/or the automated or autonomous driving module(s) 160 can be operatively connected to communicate with the various vehicle systems 140 and/or individual components thereof. For example, returning to FIG. 1, the processor(s) 110 and/or the autonomous driving module(s) 160 can be in communication to send and/or receive information from the various vehicle systems 140 to control the movement of the vehicle 100. The processor(s) 110, the prediction system 170, and/or the autonomous driving module(s) 160 may control some or all of the vehicle systems 140 and, thus, may be partially or fully autonomous as defined by the society of automotive engineers (SAE) levels 0 to 5.

The processor(s) 110, the prediction system 170, and/or the autonomous driving module(s) 160 can be operatively connected to communicate with the various vehicle systems 140 and/or individual components thereof. For example, returning to FIG. 1, the processor(s) 110, the prediction system 170, and/or the autonomous driving module(s) 160 can be in communication to send and/or receive information from the various vehicle systems 140 to control the movement of the vehicle 100. The processor(s) 110, the prediction system 170, and/or the autonomous driving module(s) 160 may control some or all of the vehicle systems 140.

The processor(s) 110, the prediction system 170, and/or the autonomous driving module(s) 160 may be operable to control the navigation and maneuvering of the vehicle 100 by controlling one or more of the vehicle systems 140 and/or components thereof. For instance, when operating in an autonomous mode, the processor(s) 110, the prediction system 170, and/or the autonomous driving module(s) 160 can control the direction and/or speed of the vehicle 100. The processor(s) 110, the prediction system 170, and/or the autonomous driving module(s) 160 can cause the vehicle 100 to accelerate, decelerate, and/or change direction. As used herein, "cause" or "causing" means to make, force, compel, direct, command, instruct, and/or enable an event or action to occur or at least be in a state where such event or action may occur, either in a direct or indirect manner.

The vehicle 100 can include one or more actuators 150. The actuators 150 can be an element or a combination of elements operable to alter one or more of the vehicle systems 140 or components thereof responsive to receiving signals or other inputs from the processor(s) 110 and/or the autonomous driving module(s) 160. For instance, the one or more actuators 150 can include motors, pneumatic actuators, hydraulic pistons, relays, solenoids, and/or piezoelectric actuators, just to name a few possibilities.

The vehicle 100 can include one or more modules, at least some of which are described herein. The modules can be implemented as computer-readable program code that, when executed by a processor(s) 110, implement one or more of the various processes described herein. One or more of the modules can be a component of the processor(s) 110, or one or more of the modules can be executed on and/or distributed among other processing systems to which the processor(s) 110 is operatively connected. The modules can include instructions (e.g., program logic) executable by the one or more processors 110. Alternatively, or in addition, one or more data stores 115 may contain such instructions.

In one or more arrangements, one or more of the modules described herein can include artificial intelligence elements, e.g., neural network, fuzzy logic, or other ML algorithms. Further, in one or more arrangements, one or more of the modules can be distributed among a plurality of the modules described herein. In one or more arrangements, two or more of the modules described herein can be combined into a single module.

The vehicle 100 can include one or more autonomous driving modules 160. The autonomous driving module(s) 160 can be configured to receive data from the sensor system 120 and/or any other type of system capable of capturing information relating to the vehicle 100 and/or the external environment of the vehicle 100. In one or more arrangements, the autonomous driving module(s) 160 can use such data to generate one or more driving scene models. The autonomous driving module(s) 160 can determine position and velocity of the vehicle 100. The autonomous driving module(s) 160 can determine the location of obstacles, obstacles, or other environmental features including traffic signs, trees, shrubs, neighboring vehicles, pedestrians, etc.

The autonomous driving module(s) 160 can be configured to receive, and/or determine location information for obstacles within the external environment of the vehicle 100 for use by the processor(s) 110, and/or one or more of the modules described herein to estimate position and orientation of the vehicle 100, vehicle position in global coordinates based on signals from a plurality of satellites, or any other data and/or signals that could be used to determine the current state of the vehicle 100 or determine the position of the vehicle 100 with respect to its environment for use in either creating a map or determining the position of the vehicle 100 in respect to map data.

The autonomous driving module(s) 160 either independently or in combination with the prediction system 170 can be configured to determine travel path(s), current autonomous driving maneuvers for the vehicle 100, future autonomous driving maneuvers and/or modifications to current autonomous driving maneuvers based on data acquired by the sensor system 120, driving scene models, and/or data from any other suitable source such as determinations from the sensor data 240. "Driving maneuver" means one or more actions that affect the movement of a vehicle. Examples of driving maneuvers include: accelerating, decelerating, braking, turning, moving in a lateral direction of the vehicle 100, changing travel lanes, merging into a travel lane, and/or reversing, just to name a few possibilities. The autonomous driving module(s) 160 can be configured to implement determined driving maneuvers. The autonomous driving module(s) 160 can cause, directly or indirectly, such autonomous driving maneuvers to be implemented. As used herein, "cause" or "causing" means to make, command, instruct, and/or enable an event or action to occur or at least be in a state where such event or action may occur, either in a direct or indirect manner. The autonomous driving module(s) 160 can be configured to execute various vehicle functions and/or to transmit data to, receive data from, interact with, and/or control the vehicle 100 or one or more systems thereof (e.g., one or more of vehicle systems 140).

Detailed embodiments are disclosed herein. However, it is to be understood that the disclosed embodiments are intended as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-6, but the embodiments are not limited to the illustrated structure or application.

The flowcharts and block diagrams in the figures illustrate the architecture, functionality, and operation of possible implementations of systems, methods, and computer program products according to various embodiments. In this regard, a block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein.

The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a ROM, an EPROM or Flash memory, a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Generally, modules as used herein include routines, programs, objects, components, data structures, and so on that perform particular tasks or implement particular data types. In further aspects, a memory generally stores the noted modules. The memory associated with a module may be a buffer or cache embedded within a processor, a RAM, a ROM, a flash memory, or another suitable electronic storage medium. In still further aspects, a module as envisioned by the present disclosure is implemented as an ASIC, a hardware component of a system on a chip(SoC), as a programmable logic array (PLA), or as another suitable hardware component that is embedded with a defined configuration set (e.g., instructions) for performing the disclosed functions.

Program code embodied on a computer-readable medium may be transmitted using any appropriate medium, including but not limited to wireless, wireline, optical fiber, cable, radio frequency (RF), etc., or any suitable combination of the foregoing. Computer program code for carrying out operations for aspects of the present arrangements may be written in any combination of one or more programming languages, including an object-oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . ." as used herein refers to and encompasses any and all combinations of one or more of the associated listed items. As an example, the phrase "at least one of A, B, and C" includes A, B, C, or any combination thereof (e.g., AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A prediction system comprising:
    a memory communicably coupled to a processor and storing:
    a prediction module including instructions that when executed by the processor cause the processor to:
    classify cycle life of a battery into a class using battery data from cycling with a protocol, wherein the class represents cycle life distributions of cycling protocols different from the protocol;
    quantify, using the class in a hierarchical Bayesian model (HBM), variability for the battery induced by the protocol compared with the cycling protocols;
    adjust, using observation levels of the HBM, parameters for the cycle life, wherein the parameters are associated with the cycle life distributions and the HBM reduces the variability;
    predict, using the HBM, an adjusted cycle life for the protocol according to the cycle life and the variability; and
    communicate a signal that causes a device to operate the battery using the protocol according to the adjusted cycle life.

2. The prediction system of claim 1, wherein the HBM factors the cycle life distributions, battery variability measured by the cycling protocols, and total cycles distributions of the cycling protocols to compute the adjusted cycle life.

3. The prediction system of claim 2, wherein the cycle life distributions is a level of the HBM and the battery variability and the total cycles distributions are another level of the HBM.

4. The prediction system of claim 1, wherein the HBM factors in the adjusted cycle life prior expectations of the cycling protocols for performance associated with various batteries.

5. The prediction system of claim 1, wherein the prediction module further includes instructions to cycle the battery using the protocol when the adjusted cycle life satisfies criteria for total cycles until degradation.

6. The prediction system of claim 1, wherein the prediction module includes instructions to classify the battery further including instructions to determine, using a prediction model, the class according to constructed features using other data from electrochemical cycling of the battery.

7. The prediction system of claim 1, wherein the prediction module further includes instructions to determine whether a confidence of the adjusted cycle life satisfies criteria for the cycling protocols.

8. The prediction system of claim 1, wherein the cycle life represents cycles until a charge level of the battery degrades and the cycling protocols represent charging protocols for the battery.

9. A non-transitory computer-readable medium comprising:
instructions that when executed by a processor cause the processor to:
classify cycle life of a battery into a class using battery data from cycling with a protocol, wherein the class represents cycle life distributions of cycling protocols different from the protocol;
quantify, using the class in a hierarchical Bayesian model (HBM), variability for the battery induced by the protocol compared with the cycling protocols;
adjust, using observation levels of the HBM, parameters for the cycle life, wherein the parameters are associated with the cycle life distributions and the HBM reduces the variability;
predict, using the HBM, an adjusted cycle life for the protocol according to the cycle life and the variability; and
communicate a signal that causes a device to operate the battery using the protocol according to the adjusted cycle life.

10. The non-transitory computer-readable medium of claim 9, wherein the HBM factors the cycle life distributions, battery variability measured by the cycling protocols, and total cycles distributions of the cycling protocols to compute the adjusted cycle life.

11. The non-transitory computer-readable medium of claim 10, wherein the cycle life distributions is a level of the HBM and the battery variability and the total cycles distributions are another level of the HBM.

12. The non-transitory computer-readable medium of claim 9, wherein the instructions to classify the battery further include instructions to determine, using a prediction model, the class according to constructed features using other data from electrochemical cycling of the battery.

13. A method, comprising:
classifying cycle life of a battery into a class using battery data from cycling with a protocol, wherein the class represents cycle life distributions of cycling protocols different from the protocol;
quantifying, using the class in a hierarchical Bayesian model (HBM), variability for the battery induced by the protocol compared with the cycling protocols;
adjusting, using observation levels of the HBM, parameters for the cycle life, wherein the parameters are associated with the cycle life distributions and the HBM reduces the variability;
predicting, using the HBM, an adjusted cycle life for the protocol according to the cycle life and the variability; and
communicating a signal that causes a device to operate the battery using the protocol according to the adjusted cycle life.

14. The method of claim 13,
wherein the HBM factors the cycle life distributions, battery variability measured by the cycling protocols, and total cycles distributions of the cycling protocols to compute the adjusted cycle life.

15. The method of claim 14, wherein the cycle life distributions is a level of the HBM and the battery variability and the total cycles distributions are another level of the HBM.

16. The method of claim 13,
wherein the HBM factors in the adjusted cycle life prior expectations of the cycling protocols for performance associated with various batteries.

17. The method of claim 13, further comprising:
cycling the battery using the protocol when the adjusted cycle life satisfies criteria for total cycles until degradation.

18. The method of claim 13, wherein classifying of the battery includes determining, using a prediction model, the class according to constructed features using other data from electrochemical cycling of the battery.

19. The method of claim 13, further comprising:
determining whether a confidence of the adjusted cycle life satisfies criteria for the cycling protocols.

20. The method of claim 13, wherein the cycle life represents cycles until a charge level of the battery degrades and the cycling protocols represent charging protocols for the battery.

* * * * *

UNITED STATES PATENT AND TRADEMARK OFFICE
CERTIFICATE OF CORRECTION

PATENT NO. : 11,614,491 B2
APPLICATION NO. : 17/235356
DATED : March 28, 2023
INVENTOR(S) : Richard Dean Braatz et al.

It is certified that error appears in the above-identified patent and that said Letters Patent is hereby corrected as shown below:

In the Specification

In Column 8, Line 44, after "about" replace "a" with "$\alpha$".
In Column 8, Line 47, replace "$\Theta^l$" with "$\Theta^i$".
In Column 8, Line 48, after "over" replace "(a, ft)" with "$(\alpha, \beta)$".
In Column 10, Line 27, after "degree" replace "(a)" with "$(\alpha)$".
In Column 10, Line 29, after "degree" replace "a" with "$\alpha$".
In Column 10, Line 29, after "e.g.," replace "a" with "$\alpha$".
In Column 10, Line 32, after "degree" replace "a" with "$\alpha$".
In Column 10, Line 53, after "that" replace "$y^{new}$" with "$y^i$".
In Column 10, please replace Equation (2) with "$p(y^i|n^i) \sim Multinomial(\Theta^i)$".
In Column 12, Line 38, after "life" replace "(e.g. a)" with "(e.g. $\alpha$)".
In Column 13, Line 1, after "i.e.," replace "$\Theta n$" with "$\Theta^n$".
In Column 13, Line 24, after "degree" replace "a" with "$\alpha$".

Signed and Sealed this
Second Day of May, 2023

*Katherine Kelly Vidal*

Katherine Kelly Vidal
*Director of the United States Patent and Trademark Office*